US007467976B2

(12) United States Patent  
Ting

(10) Patent No.: US 7,467,976 B2  
(45) Date of Patent: Dec. 23, 2008

(54) STACKED CARD CONNECTOR

(75) Inventor: Chien-Jen Ting, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/148,884

(22) Filed: Apr. 23, 2008

(65) Prior Publication Data

US 2008/0261416 A1 Oct. 23, 2008

(30) Foreign Application Priority Data

Apr. 23, 2007 (TW) .............................. 96206453 U

(51) Int. Cl.
*H01R 13/648* (2006.01)
(52) U.S. Cl. .................... 439/607; 439/541.5
(58) Field of Classification Search ................ 439/607, 439/541.5, 159
See application file for complete search history.

(56) References Cited

U.S. PATENT DOCUMENTS

| 6,102,708 | A | | 8/2000 | Kimura | |
| 6,132,243 | A | * | 10/2000 | Hirata et al. ............. | 439/541.5 |
| 6,146,193 | A | * | 11/2000 | Yu ........................... | 439/541.5 |
| 7,101,222 | B2 | * | 9/2006 | Ho et al. .................. | 439/541.5 |
| 7,189,088 | B2 | | 3/2007 | Cheng | |
| 2006/0196781 | A1 | | 9/2006 | Kimura | |

* cited by examiner

*Primary Examiner*—Tho D Ta  
(74) *Attorney, Agent, or Firm*—Wei Te Chung

(57) ABSTRACT

A stacked card connector (100) includes a first connector and a second connector stacked with the first connector. The first connector comprises a first shell (1) and an insulating housing (2) receiving a plurality of first terminals (3). The first shell is mounted on the insulating housing to define a first card slot (9) and a card inserting direction. The second connector comprises a second shell (4) and a terminal module (45) associating with the second shell to define a second card slot (9'). Wherein the first shell comprises a body plate (10) and a pair of lateral side walls (12) extending from the body plate, each lateral side wall comprises a locking clasp (121), and the second shell forms a pair of locking pieces (46) fastening with the locking clasps.

12 Claims, 3 Drawing Sheets

STACKED CARD CONNECTOR

BACKGROUND OF THE INVENTION

1. Field of the Invention

The present invention relates to a card connector to be used in a personal computer or the like for connecting and disconnecting a card to the personal computer. Here, the card generally refers to a memory card such as personal computer (PC) card or the like.

2. Description of Prior Arts

A conventional stacked card connector has an insulator body supporting contact elements. The card connector has two insulator bodies forwardly extending in parallel with each other to form a space therebetween. The card connector further has two metal shield plates fixed to the insulator body to cover the space, so that a card receiving slot is provided. The shield plates defined an upper wall and a lower wall of the card receiving slot. The shield plates have outer sides extending onto outer side surfaces of the arms. The shield plates are for protecting the card in the card receiving slot from ambient electromagnetic noise or the electromagnetic interference (EMI).

A prior art discloses a stacked card connector that has two insulator body superposed on each other, hereinafter as an upper insulator body and a lower insulator body, and two metal shield plates mounted on corresponding upper insulator body and lower insulator body. On each outer lateral side surface of the shield plate, a pair of standing foots extends therefrom to engaging with a printed circuit board. Thereby, the two standing foots on the upper metal shield are longer than that of the lower standing foots as a result of the upper insulator body. Each standing foots has a through hole for a position member passing through. When the two shields are coupled, a pair of screws pass through the through holes allowing the upper shield plate to lock on the lower shield plate. Accordingly, the upper insulator body placed on the lower insulator body to form the card connector.

In the card connector as described above, the two shield plates are superposed on each other by the screws passing through the through holes of the standing foots. However, the standing foots are designed in a narrow and long shape, it is hard to place one standing foot rightly overlapping on the other. Therefore, in assembly, the screws may be in such condition that they pass through the through holes of the standing foots on the upper metal shield, but can not rightly go into the through holes of the lower metal shield. In addition, both of the shield plate are designed with a pair of standing foots, not only need a complicate module of the shield, but also use more metal material.

Therefore, the present invention is directed to solving these various problems.

SUMMARY OF THE INVENTION

An object, therefore, of the invention is to provide a stacked card connector with two shell superposed on each other simply, and save material.

In the exemplary embodiment of the invention, a stacked card connector includes a first connector and a second connector stacked with the first connector. The first connector comprises a first shell and an insulating housing receiving a plurality of first terminals. The first shell is mounted on the insulating housing to define a first card slot and a card inserting direction. The second connector comprises a second shell and a terminal module associating with the second shell to define a second card slot. Wherein the first shell comprises a body plate and a pair of lateral side walls extending from the body plate, each lateral side wall comprises a locking clasp, and the second shell forms a pair of locking pieces fastening with the locking clasps.

Other objects, advantages and novel features of the invention will become more apparent from the following detailed description of the present embodiment when taken in conjunction with the accompanying drawings.

DETAILED DESCRIPTION OF THE PREFERRED EMBODIMENT

An embodiment of the present invention will be described with reference to FIG. 1 through FIG. 3.

Figure 1:
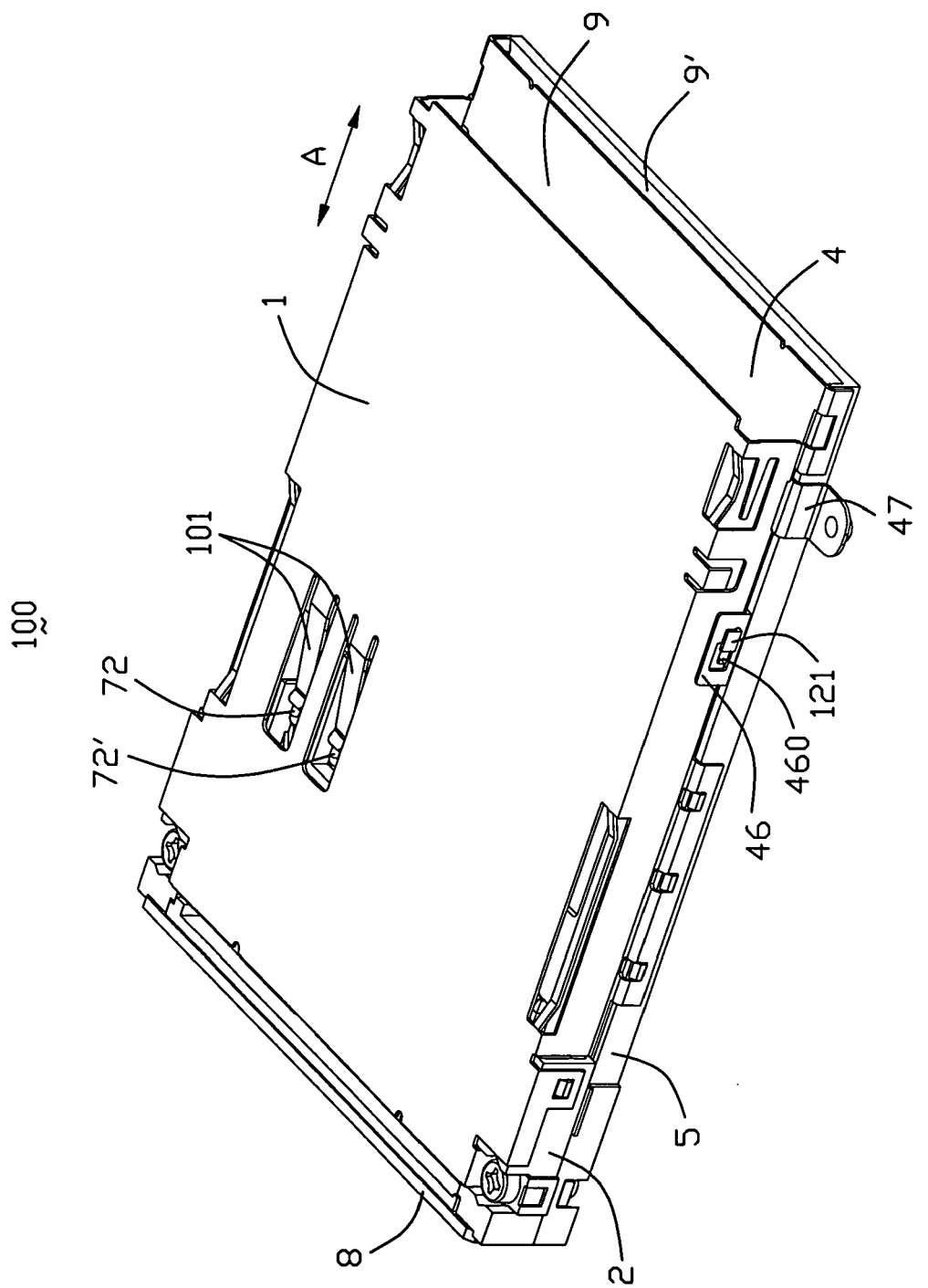
FIG. 1 is a perspective view of a stacked card connector of present invention.

In FIG. 1, a stacked card connector 100 of present invention comprises a first connector (not labeled), a second connector (not labeled) mounted under the first connector, a daughter board 81 and a rear socket 82 hereinafter as a socket portion 8. Both first connector and second connector are formed with a card slot 9 as a first card slot, 9' as a second card slot for receiving a first card, such as an Express card, and a second card, such as a smart card, respectively. The daughter board 81 is mounted on a rear end of the card connector, and a lower edge thereof is partially inserted into the rear socket 82 to electrically engage with the rear socket 82.

Figure 2:
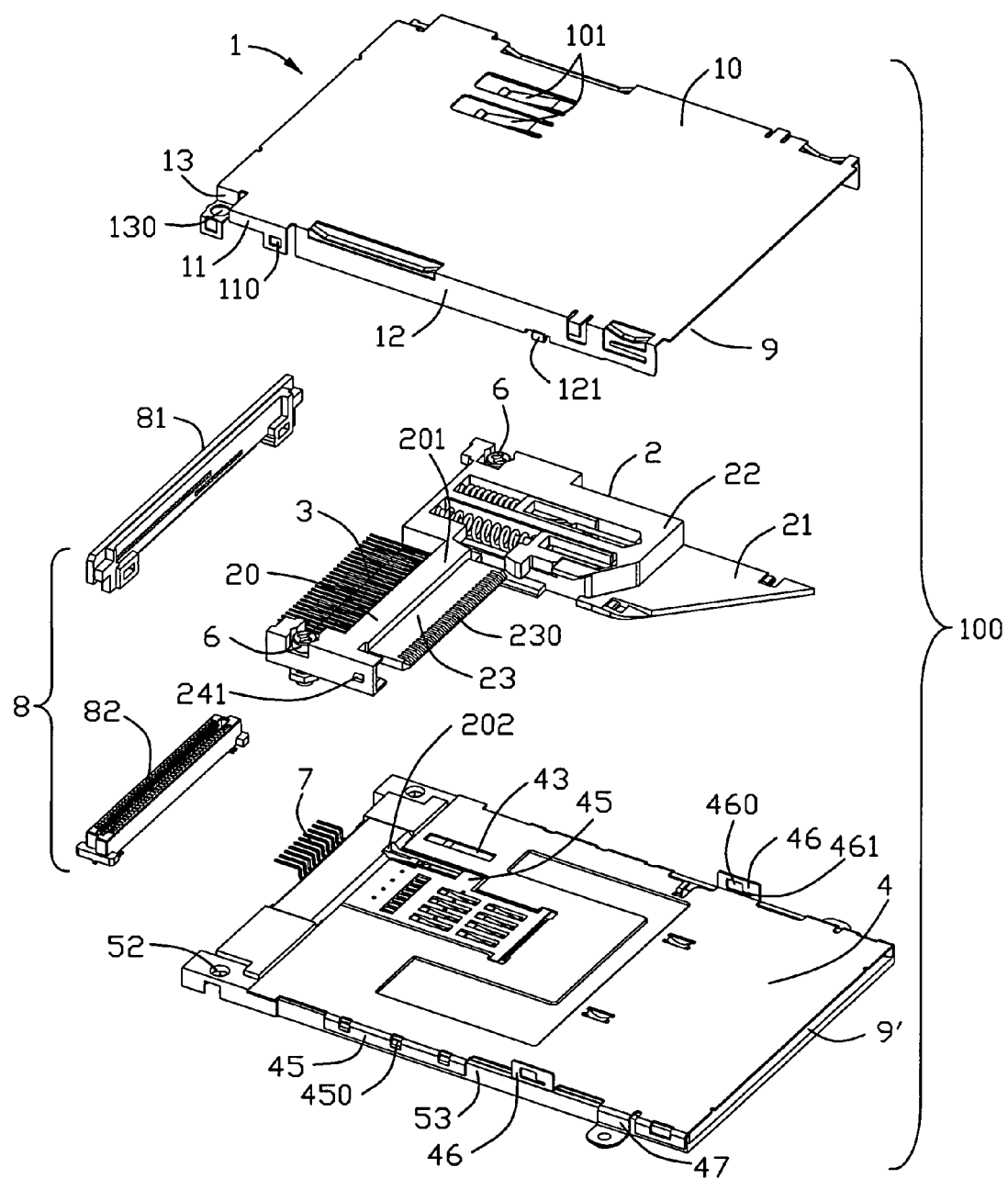
FIG. 2 is an exploded view of the stacked card connector of present invention as shown in FIG. 1.

Referring to FIG. 1 to FIG. 2, the first connector is formed in an approximately longitudinal shape, and comprises a first shell 1 in a rectangular shape, and an insulating housing 2 receiving a plurality of first terminals 3. The first shell comprises a body plate 10, a pair of side walls 12 and a pair of limbs 11 adjacent to the side walls 12, respectively. Further, at the rear end of the body plate 10 response to a card inserting direction A, a pair of locking pieces 13 are formed with a receiving hole 130, respectively. Each limb 11 has a fixing hole 110, and each side wall 12 has a locking clasp 121. The locking clasp 121 is designed by the lower edge of the side wall 12 extending outwardly in a little distance and then upwardly in a longer distance. The body plate 10 has a pair of pressing pieces 101 protruding into the first card slot 9 to press on a card surface and achieve a believable connection between the first card and the first terminals 3. The insulating housing 2 is designed in a transverse length according with that of the first shell 1, and comprises a base section 20, a fixing portion 22 extending laterally from one end of the base section 20, and a guiding plate 21 extending forwardly form the fixing portion 22. An up surface of the guiding plate 21 is lower than that of the fixing portion 22. The base section 20 has an engaging plate 23 with a plurality of terminal rooms 230 for the first terminals 3 passing through. On the lateral side face of the base section 20 and the fixing portion 22, a pair of recesses 241 are formed to locking with the fixing hole 110 of the shell 1.

The second connector is in an shape approximate as the first connector, and comprises a second shell 4, a terminal module 45 receiving a plurality of second terminals 7, and a holding plate 5 (shown in FIG. 1) covered by the second shell 4. The terminal module 45 is in alignment with the second shell 4 allowing the second terminals 7 protruding into the second slot 9'. According with the screw hole 130 of the first shell 1, a pair of screw holes 52 are formed on the end of the holding plate 5. The second shell 4 has a pair of side walls 45 extending partially and downwardly therefrom, a pair of locking pieces 46 extending in an opposite direction of the side walls 45 extending, and a pair standing foots 47 extending integrally therefrom to be located on a printed circuit board. A height of the standing foot 47 is equivalent to that of the holding plate 5. The locking piece 46 has a gap 461 and a hole 460 communicating with the gap 461.

Figure 3:
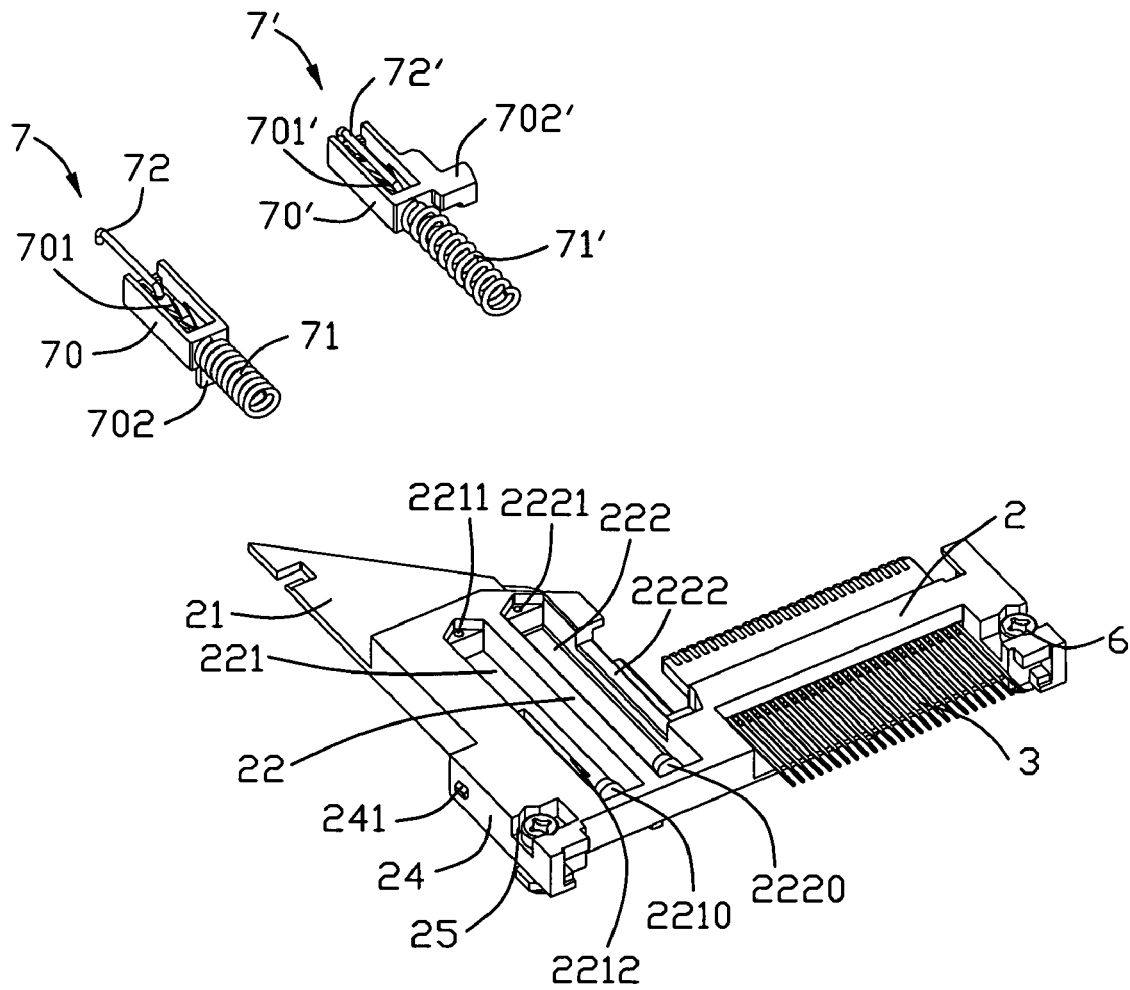
FIG. 3 is a perspective view of a pair of ejecting mechanisms and an insulating housing of the stacked card connector according with present invention.

As shown in FIG. 3, a pair of ejecting mechanisms hereinafter as the first ejecting mechanism 7' and a second ejecting mechanism 7 are mounted in a pair of fixing grooves 221, 222 of the fixing portion 22. The first ejecting mechanism 7' and the second mechanism 7 are operated by an inserted card and comprise, respectively, an ejecting member 70', 70 protruding into corresponding card slot, a spring member 71', 71 for moving the ejecting member 70', 70 towards the card ejecting direction, and a latch member 72', 72 capable of over coming the spring member 71', 71 and placing the ejecting member 70', 70 in a desirable position. The first ejecting member 71' and the second ejecting member 71, respectively, have a pushing portion 702' extending laterally from one side of the ejecting member 70', 702 extending downwardly from a bottom face of the ejecting member 70. The latch portion 72', 72 move in an operating channel 701', 701 formed on the ejecting member 70', 70, respectively.

The fixing groove 221, 222 hereinafter as a first fixing groove 221 and a second fixing groove 222, comprises correspondingly a first slipping channel 2222 communicating with the first card slot, a second slipping channel 2212 communicating with the second card slot by passing through a bottom portion of the second fixing groove 221, a hole 2221, 2211, and a post 2220, 2210. The first fixing groove and the second fixing groove are arranged in a transverse direction response to a card inserting direction.

The relationship between the first ejecting mechanism 7', the second ejecting mechanism 7 and the first fixing groove 221, the second fixing groove 222 will be described in detail. The first ejecting mechanism 7' is mounted in the first fixing groove 221 with the pushing portion 702' of the first ejecting member 70' protruding into the first card slot 9', one end of the spring member 71' connecting the ejecting member 70' and the other aligned with the post 2220, one end of the latch member 72' slipping in the operating groove 701' and the other placed in the hole 2221. The second ejecting mechanism 7 is mounted in the second groove 221 in the same way as described of the first ejecting mechanism 7, except that the second pushing portion 701 protrudes downwardly into the second card slot 9 by the second slipping channel 2212.

According to present invention, a pair of screws 6 are fastened in the screw holes of the first shell 1, the insulating housing 2, and the bottom plate 5 of the second connector in order to lock the end portion of the stacked card connector 100. More particularly, the first connector and the second connector is further locked by the locking clasp 121 fastening with the locking piece 46 in such manner that the locking clasp 121 firstly going through the aperture 460 of the locking piece 46 thereafter slipping into the gap 461. After such locking manner, it is needless to make a longer standing foots on the first shell to mating with the standing foots 47 of the second shell 4. When the card connector is printed on a circuit board, only with the standing foots 47 of the second shell to be printed thereon, and the screws 6 locking the end portion of the card connector with the printed circuit board. A departure of the first shell and the second shell will not occur due to the locking piece 46 locking with the locking clasp 121 first during an assembly of the card connector.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. A stacked card connector, comprising:
a first connector comprising a first shell and an insulating housing receiving a plurality of first terminals, the first shell mounted on the insulating housing to define a first card slot and a card inserting direction; and
a second connector stacked with the first connector and comprising a second shell and a terminal module associated with the second shell to define a second card slot;
wherein the first shell comprises a body plate and a pair of lateral side walls extending from the body plate, each lateral side wall comprises a locking clasp, and the second shell forms a pair of locking pieces fastening with the locking clasps;
wherein the insulating housing comprises a base section receiving the first terminals, a fixing portion extending laterally from the base section and a guiding plate extending forwardly from the fixing portion; wherein a pair of ejecting mechanisms are retained on the fixing portion; wherein the ejecting mechanisms are arranged in the fixing portion in a transverse direction with respect to the card insertion direction; wherein the fixing portion defines a pair of fixing grooves, and the ejecting mechanism are retained therein, respectively.

2. The stacked card connector as claimed in claim 1, wherein the locking piece comprises a hole and a gap communicating with each other, and the locking clasp is fastened in the gap by slipping from the hole into the gap.

3. The stacked card connector as claimed in claim 1, wherein the locking clasps extend outwardly and upwardly from the lateral side walls of the first shell, respectively.

4. The stacked card connector as claimed in claim 1, wherein the locking pieces extend upwardly from the lateral sides of the second shell, respectively.

5. The stacked electrical card connector as claimed in claim 1, wherein the grooves comprises a first fixing groove adjacent to the base section and a second fixing groove, the first fixing groove has a first sliding channel defined on a lateral wall thereof, and the second fixing groove has a second sliding channel defined on a bottom thereof.

6. The stacked electrical card connector as claimed in claim 1, wherein each ejecting mechanism is operated by an inserted card.

7. The stacked electrical card connector as claimed in claim 1, further comprising a socket portion mounted behind the insulating housing.

8. The stacked card connector as claimed in claim 7, wherein the socket portion comprises a rear socket and a daughter board received in the rear socket, and the first terminals and the terminal module connect with the daughter board electrically.

9. A stacked card connector comprising:
an upper connector port including an upper insulative housing with an upper metallic shell on top of said upper housing;

the upper connector port being equipped with a plurality of upper contacts;

an upper card receiving space formed between the upper housing and the upper shell in a vertical direction;

a lower connector port including a lower insulative housing with a lower metallic shell on top of said lower housing;

the lower connector port being equipped with a plurality of lower contacts;

a lower card receiving space formed between the lower shell and the lower housing;

one of the upper shell and the lower shell being equipped with a locking clasp and the other of the upper shell and the lower shell being equipped with a locking piece under a condition that the locking clasp and the locking piece are initially assembled in a lateral direction perpendicular to both the vertical direction and a front-to-back direction, and successively in the front-to-back direction so as to have the upper shell and the lower shell restrained with each other in both the vertical direction and the lateral direction;

wherein the upper insulating housing comprises a base section receiving the upper contacts, a fixing portion extending laterally from the base section and a guiding plate extending forwardly from the fixing portion; wherein a pair of ejecting mechanisms are retained on the fixing portion; wherein the ejecting mechanisms are arranged in the fixing portion in a transverse direction with respect to a card insertion direction; wherein the fixing portion defines a pair of fixing grooves, and the ejecting mechanism are retained therein, respectively.

10. The stacked card connector as claimed in claim 9, wherein the lower contacts are disposed in a terminal module which is attached to the lower shell.

11. A stacked card connector comprising:

an upper connector port including an upper insulative housing with an upper metallic shell on top of said upper housing;

the upper connector port being equipped with a plurality of upper contacts;

an upper card receiving space formed around the upper housing and the upper shell;

a lower connector port including a lower insulative housing with a lower metallic shell assembled to said lower housing;

the lower connector port being equipped with a plurality of lower contacts;

a lower card receiving space formed around the lower shell and the lower housing;

one of the upper shell and the lower shell being equipped with a locking clasp and the other of the upper shell and the lower shell being equipped with a locking piece under a condition that the locking clasp and the locking piece are initially assembled in a lateral direction perpendicular to both a vertical direction and a front-to-back direction, and successively in the front-to-back direction so as to have the upper shell and the lower shell restrained with each other in both the vertical direction and the lateral direction;

wherein the upper insulating housing comprises a base section receiving the upper contacts, a fixing portion extending laterally from the base section and a guiding plate extending forwardly from the fixing portion; wherein a pair of ejecting mechanisms are retained on the fixing portion; wherein the ejecting mechanisms are arranged in the fixing portion in a transverse direction with respect to a card insertion direction; wherein the fixing portion defines a pair of fixing grooves, and the ejecting mechanism are retained therein, respectively.

12. The stacked card connector as claimed in claim 11, wherein the lower contacts are disposed in a terminal module which is attached to the lower shell.

\* \* \* \* \*